United States Patent [19]
Tsuto

[11] Patent Number: 6,032,275
[45] Date of Patent: *Feb. 29, 2000

[54] TEST PATTERN GENERATOR

[75] Inventor: Masaru Tsuto, Gyoda, Japan

[73] Assignee: Advantest Corp., Tokyo, Japan

[ * ] Notice: This patent is subject to a terminal disclaimer.

[21] Appl. No.: 09/143,902

[22] Filed: Aug. 31, 1998

Related U.S. Application Data

[63] Continuation of application No. 08/849,653, filed as application No. PCT/JP96/00037, Dec. 1, 1996, Pat. No. 5,850,402.

[51] Int. Cl.[7] .............................. G11C 29/00; G01R 31/28
[52] U.S. Cl. ........................... 714/720; 714/720; 714/742
[58] Field of Search ................................... 714/720, 738, 714/742, 743, 744, 719, 819; 365/201; 324/73.1

[56] References Cited

U.S. PATENT DOCUMENTS

| | | | |
|---|---|---|---|
| 4,670,879 | 6/1987 | Okino | 714/743 |
| 4,862,460 | 8/1989 | Yamaguchi | 714/743 |
| 4,876,685 | 10/1989 | Rich | 714/718 |
| 5,668,819 | 9/1997 | Fukushima | 714/736 |
| 5,673,271 | 9/1997 | Ohsawa | 714/723 |
| 5,751,738 | 5/1998 | Shimura | 714/744 |

*Primary Examiner*—Hoa Nguyen
*Attorney, Agent, or Firm*—Muramatsu & Associates

[57] ABSTRACT

It is to provide a test pattern generator that can easily generate expected value data for arbitrary initial values when testing a memory device having a function of write enable/disable control per bit. The pattern generator includes an XOR controller (131) which generates a control signal in response to instructions from an instruction memory (112), an AND gate which receives an output signal of the XOR controller (131) at its one terminal and an inverted output signal of a data generator B (15) at its other input terminal, and an exclusive OR gate (121) which receives an output of the AND gate (123) at its one input terminal and an output a data generator A (14) at the other input terminal.

8 Claims, 5 Drawing Sheets bit    3   2   1   0

Memory Bit Before Data Written

Write Data

Write Mask Data

Memory Bit After Writing Data

En: Write Enable    Dis: Write Disable

Conventional Example

Example of Present Invention

TEST PATTERN GENERATOR

This is a continuation of U.S. application Ser. No. 08/849,653, filed Sep. 8, 1997 now as U.S. Pat. No. 5,850,402 which is a 371 of PCT/JP96/00037 filed Dec. 1, 1996.

TECHNICAL FIELD

This invention relates to a test pattern generator for testing semiconductor devices under test, and more particularly, to a test pattern generator which simplifies the generation of expected data, generation of which tends to be complex.

BACKGROUND ART

FIG. 2 shows an example of a semiconductor test system in a conventional technology for testing whether the devices under test are defective or not. The example of FIG. 2 shows a case in which devices to be tested are semiconductor memories. A data signal is provided from a data generator A14 to a memory device under test. A mask data signal which prohibits the data signal from entering the memory device under test is provided from the data generator B15. By a wave formatter 2, the data and mask signals are shaped their waveforms and supplied to the memory 3 under test. An address signal is provided from an address generator 13. Each of the generators noted above performs the data generation based on the instructions from an instruction memory 12. The instruction memory 12 is controlled by a program counter 11. The test pattern generator 10 is comprised of the above noted respective generators, the instruction memory, and the program counter.

Next, the data that has been read-out from the memory device 3 under test is compared with an expected data signal from the data generator A14 by a logic comparator 4. The performance of the memory device 3 under test is evaluated by comparing whether the data from the memory device 3 coincides with the expected data.

Among semiconductor memories, there exists a type of memory device that can perform a write enable and/or disable control for each data bit. For writing data in this type of semiconductor memory device, write mask data having the same number of bits as that of write data are applied to the memory device together with the write data. Only when the write mask data corresponding to the memory bit is "1", the data in the memory bit is renewed. FIG. 3 shows an example of process for writing the data in such a semiconductor memory device when the bit width of the memory device is four (4). In this example, the write mask data is #E, and thus, the write data for the memory bits "1", "2" and "3" renewed. For the memory bit "0", the previous data is maintained without change.

To test the semiconductor memory devices that can control its write enable and/or disable for each data bit as explained above, many test pattern generators include two systems of data generators (14, 15). When writing the data, one data generator is used for generating the write data while the other data generator is used for generating the write mask data. When reading the data from the memory, one of the data generators is used for generating expected value data. The data generator is arbitrarily selected and is connected to the logic comparator 4.

FIG. 4 shows an example of operation in the conventional technology. The example of FIG. 4 shows the case where initialization data from the data generator A is expressed as #3. In the initialization step, all of the memory bits must be write enable, and thus the write mask data from the data generator B shows #F. Hence the data #3 is written in the memory device under test as the initialization data.

In the write step, the write data from the data generator A in this example is #C. The write data corresponds to the inverse data of the initialization data (#3). The write mask data from the data generator B in this case is #E. Hence, in the memory device under test, data "0" is written in the memory bit 1, data "1" is stored in the memory bit 2, data "1" is stored in the memory bit 3. Since the write mask data for the memory bit 0 is "0", the initial data of "1" is unchanged. As a result, the data #D is stored in the memory device under test.

In the read step, data identical to the data #D in the memory device under test have to be generated by the data generator A as expected value data. In other words, the expected value data must be determined by considering both the write data and the write mask data. Thus, in general, the generation of the expected data is complicated, thereby making it difficult to test memory devices having the write enable/disable control for each memory bit.

When the memory chip device under test does not have the write enable/disable control per bit function, to perform the test is relatively simple since the data identical to that used in the write step can be generated by the data generator as expected value data. Similarly, even in a case where the memory device under test has the write enable/disable control per bit function, in case where the initial value data in all of the bits are either 0 or 1, the expected value data can be easily established by using the same or reverse data of the write mask data generated by the data generator B in the write step. However, except such exceptional situations, it requires a complicated process to generate the expected value data for the memory device under tested having the write enable/disable control per bit function.

In recent years, the data bit width of memory devices to be tested which have the write enable/disable control per bit function is increasing. For example, the data bit width of 16 or 32 bit is emerging in the market in comparison with the conventional width of 4 or 8 bits. Thus, the larger the data bit width becomes, the more diversified and complicated the initialization value data in the initialization step and the mask data in the write step. Accordingly, the generation of the expected value data becomes more complex and difficult in the read step.

The present invention aims to resolve these problems. When a memory device having the write enable/disable control per bit function is to be tested, the generation of the expected value data is difficult except the data in all of the bits is either 0 or 1 as noted above. The present invention provides a test pattern generator that can easily generate expected value data for testing such memory devices without regard to the initial value data.

SUMMARY OF THE INVENTION

In the present invention, in a test pattern generator 10 for generating expected value data to test a memory device 3 under test, an exclusive OR (XOR) controller 131 is provided for generating a control signal in response to an instruction signal from an instruction memory 112. An AND gate is provided which receives the output signal from the XOR controller 131 at one input terminal and an inverse output signal of a data generator B15 at another input terminal. Further, an exclusive OR gate 121 is provided which receives the output from the AND gate 123 at one input terminal and an output signal of a data generator A14 at another input terminal, thereby comprising the test pattern generator.

According to the present invention, the output data of the XOR controller 131 is "0" in an initialization step and a write step while the output data is "1", in a read step. Thus, the AND gate 123 opens in the read step. When the output data of the data generator B is "0", an output of the AND gate is "1". Thus the signal passing through the exclusive OR gate 121, that is the output signal of the data generator A, is inverted. When the output data of the data generator B is "1", the output of the AND gate is "0". Thus the signal passing through the exclusive OR gate 121, that is the output signal of the data generator A, is not inverted. In this manner, the expected value data is generated in the read step by generating the data identical to the data generated in the write step.

DETAILED DESCRIPTION OF THE PREFERRED EMBODIMENT

The embodiment of the present invention is explained with reference to the drawings.

Figure 1:
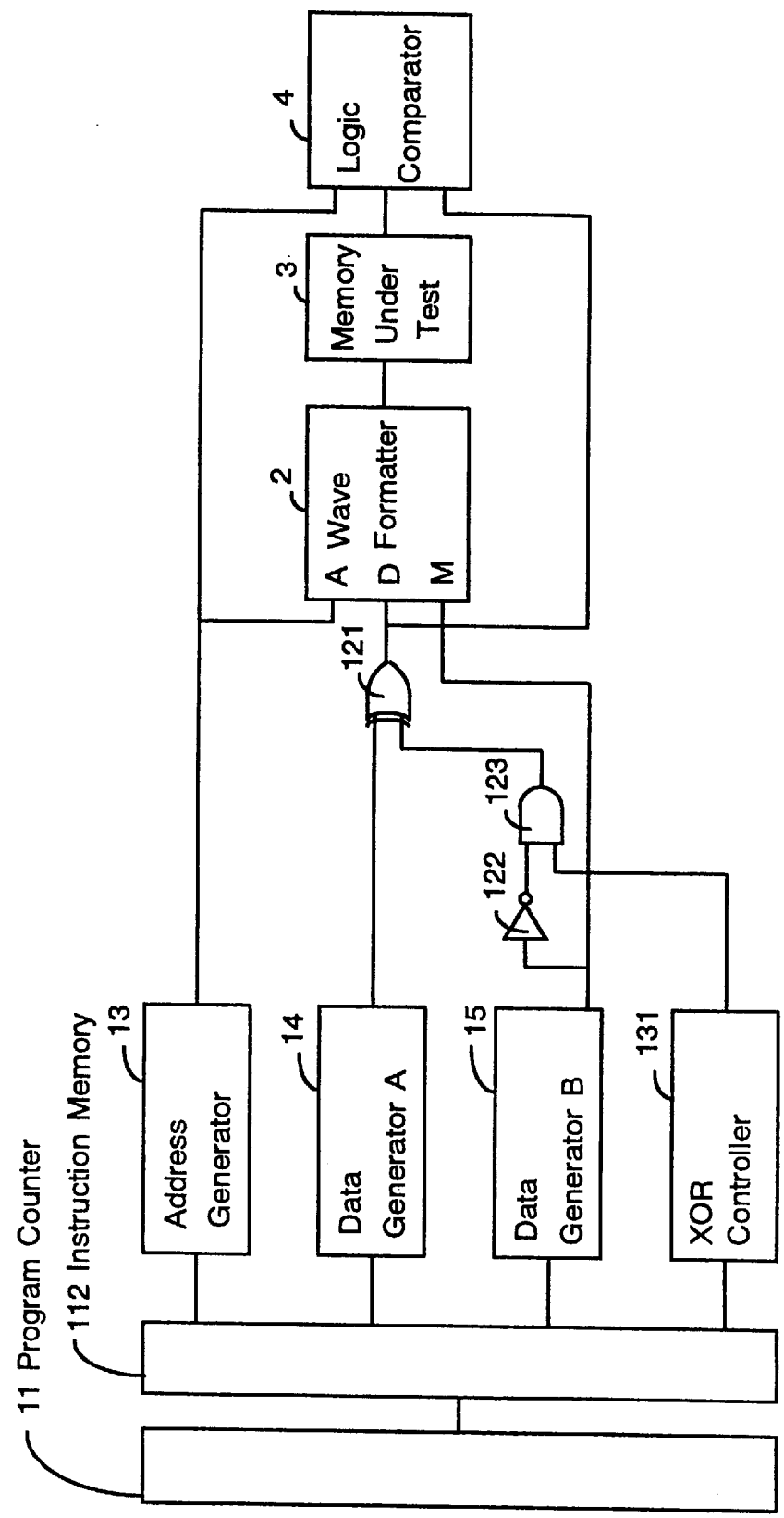
FIG. 1 is a block diagram showing an embodiment of the test pattern generator of the present invention.
Figure 2:
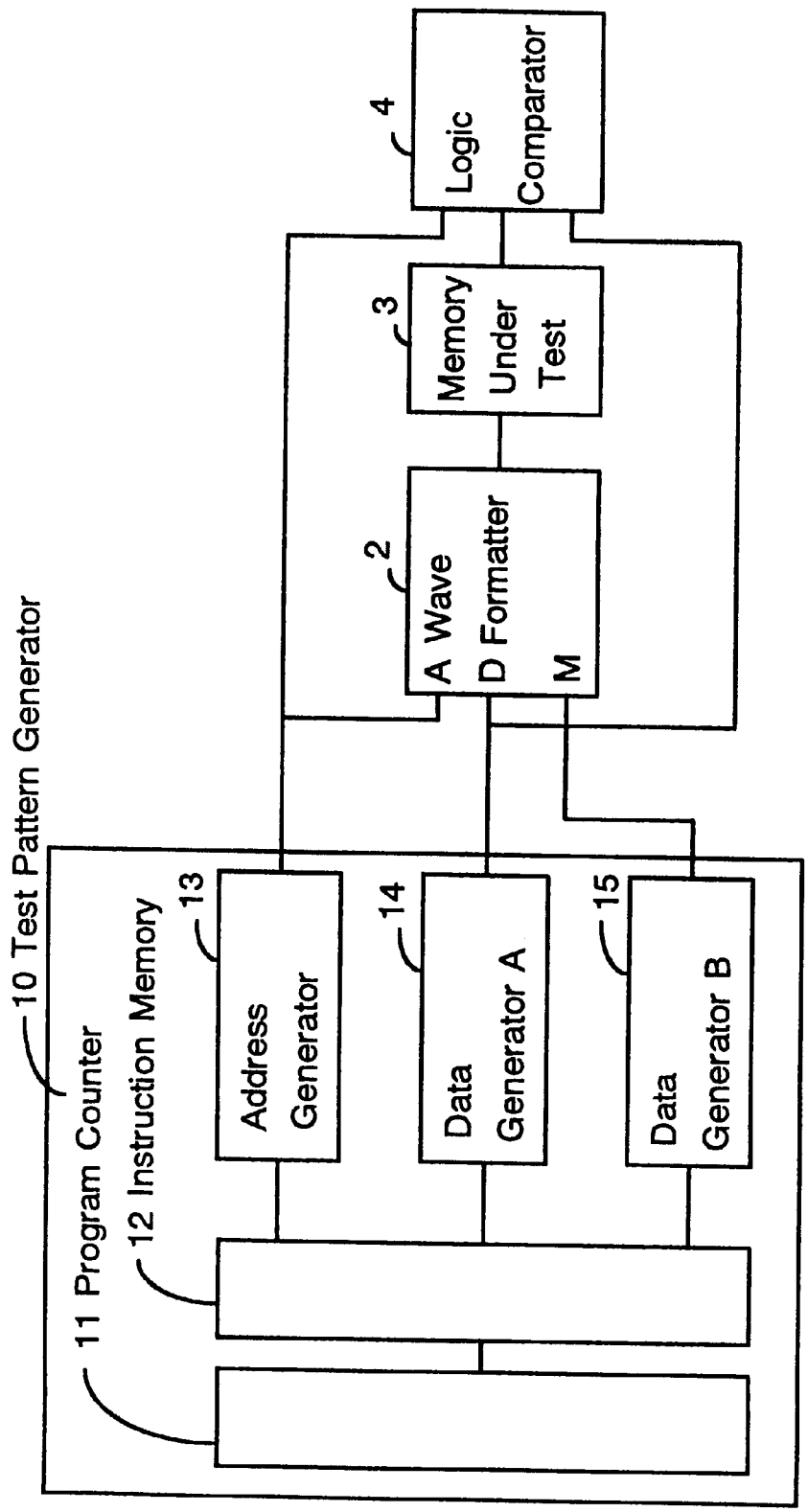
FIG. 2 is a structural diagram of a conventional semiconductor test system for evaluating memory devices under test.
Figure 3:
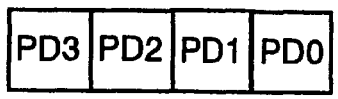
FIG. 3 is an example of writing data in a semiconductor memory when a bit width is four (4).
Figure 3:
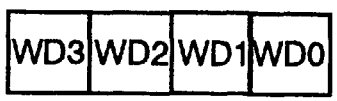
Figure 3:
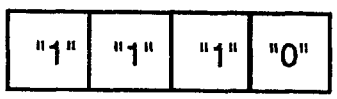
Figure 3:
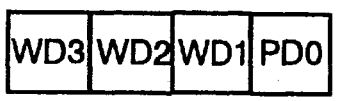
Figure 4:
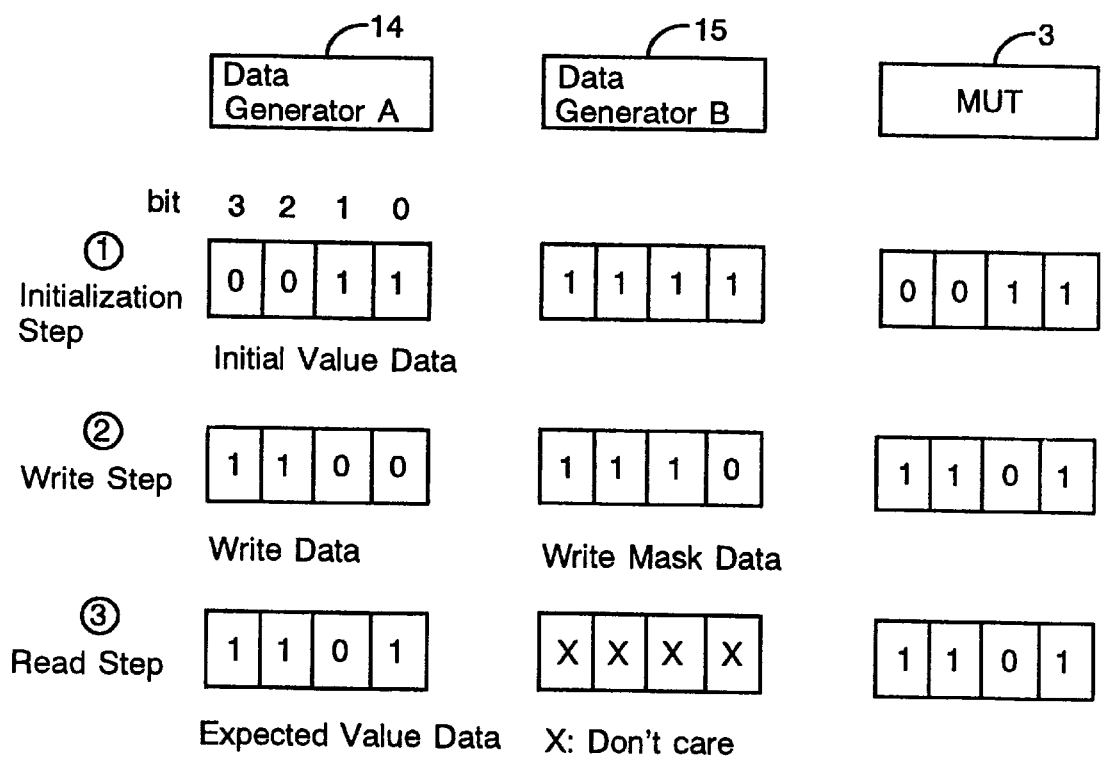
FIG. 4 shows an example of operation in the conventional technology.

FIG. 1 is a block diagram showing an embodiment of a test pattern generator of the present invention. As shown in FIG. 1, an exclusive OR gate 121 is connected at the output of a data generator A14. For the other input terminal of the exclusive OR gate 121, an output of an AND gate 123 is connected. An output of an exclusive OR (XOR) controller 131 is provided to an input terminal of the AND gate 123. The XOR controller 131 receives an instruction from an instruction memory 112. AT the other input terminal of the AND gate 123, an output of a data generator B15 is provided through an inverter 122.

Because of the configuration as described above, when an output "0" is provided from the XOR controller 131 under the instruction signal from the instruction memory 112, the output signal from the data generator A14 is provided to the wave formatter 2 as a similar manner in the conventional technology. In this situation, the output signal of the data generator A14 is also provided to a logic comparator 4 as expected value data. When the output "1" is provided from the XOR controller 131, the output signal from the data generator 14A passing the exclusive OR gate 121 is either reversed or not reversed depending on the output data of the data generator B15 and is provided to the logic comparator to be used as expected valued data.

Figure 5:
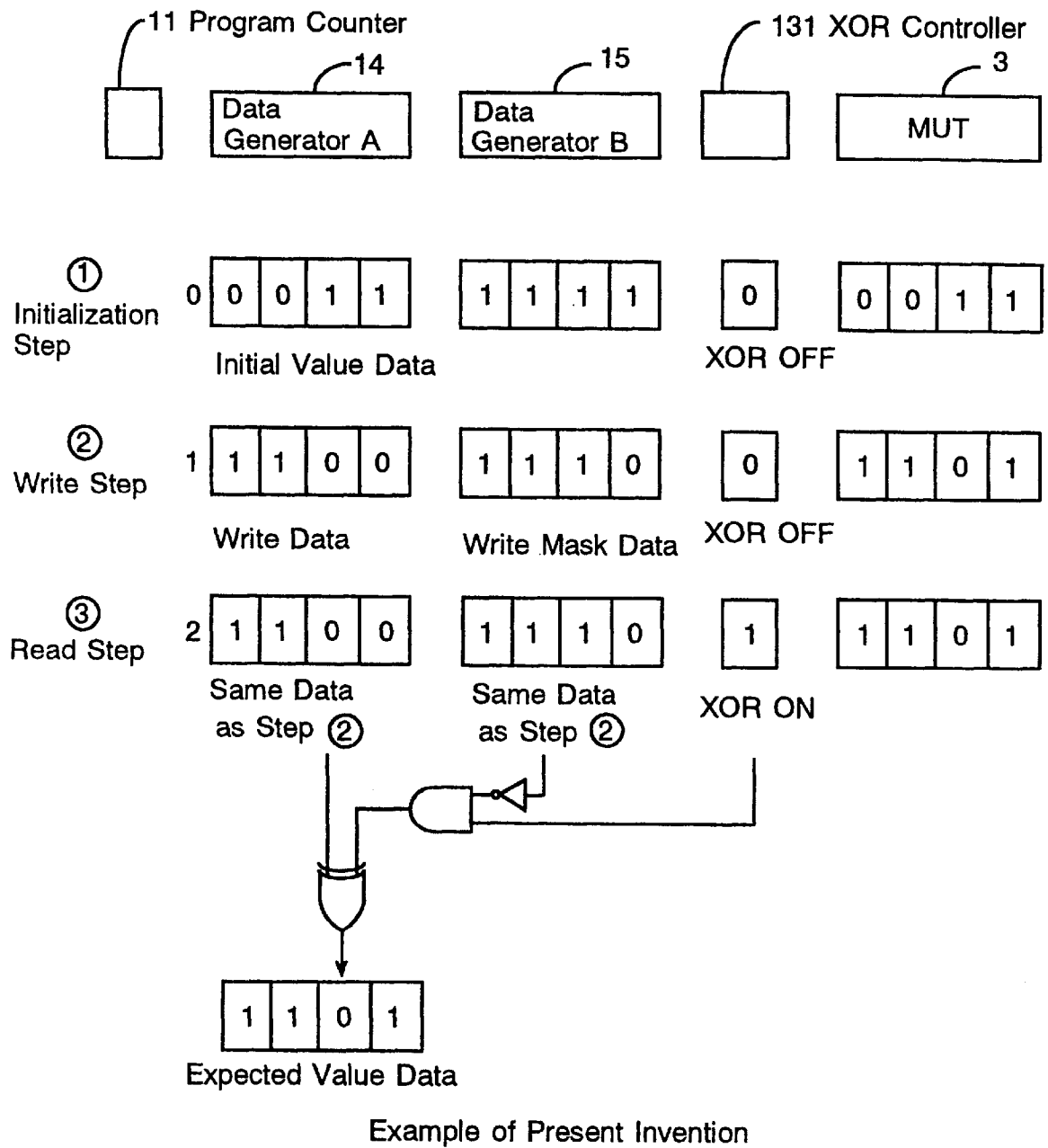
FIG. 5 shows an example of operation in the pattern generator of the present invention.

FIG. 5 shows an example of the operation of the pattern generator of the present invention. In this example, the bit width is four (4), and the initial value from the data generator A is #3. Input data in the write step is #C, which corresponds to the reverse data of the initial value #3. The write mask data in the write step is #E which prohibits the entry of write data only into the lowest memory bit. The program counter increments from 0, 1 to 2. In the read step, the following operations are performed.

The output data of the XOR controller 131 is set to "0" in the initial value step and the write step while the output data is set to "1" in the read step. Thus, the AND gate 123 opens in the read step. When the output data of the data generator B is "0", the output of the AND gate is "1". Hence the signal passing through the exclusive OR gate 121, that is the output signal of the data generator A, is reversed. When the output data of the data generator B is "1", the output of the AND gate is "0". Hence the signal passing through the exclusive OR gate 121, that is the output signal of the data generator A, is unchanged.

In the example of FIG. 5, since the output data of the data generator A is #C, and the lowest bit of the data generator B is "0", the lowest bit of the output data of the data generator A is reversed when passing through the exclusive OR gate 121, generating #D as expected value data. This expected value data #D agrees with the content #D of the memory device under test.

Thus, expected value data can be generated in the read step by generating the data identical to the write data generated in the write step. When the write data is the inverse of the initial value, the output bit of the XOR controller 131 in the write step is assigned to be "0" and the output bit of the XOR controller 131 in the read step is assigned to be "1", thus allowing the generation of the expected value data with ease by generating the data identical to the data in write step by the data generator A. Thus, according to the present invention, the expected value data can be easily generated for arbitrary initial values. Even if the bit width becomes larger or the number of bits for prohibiting the writing data in the memory increases, the present invention is easily applied because the expected value data in the read step is generated by simply reversing the data used in the write step.

Since it is configured as described in the foregoing, the present invention has the following effects. The test pattern generator can be achieved which can easily generate the expected value data with respect to arbitrary initial values for testing the memory devices having the function of the write enable/disable control per bit.

What is claimed is:

1. A test pattern generator for generating test data, expected value data and mask data for testing a memory device, comprising:

an instruction memory for storing instructions and for generating the instructions to perform a test process for a memory device under test;

a first data generator for generating test data and expected value data;

a second data generator for generating mask data for inhibiting the test data to be written in the memory device under test;

an exclusive OR (XOR) controller for generating a control signal based on the instructions from the instruction memory;

an exclusive OR (XOR) gate for performing an exclusive OR logic for the test data from the first data generator and the mask data from the second data generator in response to an output signal of the XOR controller; and a logic comparator for comparing an output signal of the memory under test with the expected value data from the first data generator when the memory under test has no write enable/disable function.

2. A test pattern generator as defined in claim 1, wherein an output signal of the exclusive OR gate is used as the expected value for comparing an output signal of the memory under test when the memory under test has a write enable/disable function.

3. A test pattern generator as defined in claim 1, wherein the test pattern generator provides the test data to the memory under test to write the test data therein in a data write step and provides the expected value data to the memory under test to read the stored data therefrom to compare the stored data with the expected valued data in a data read step, wherein the exclusive OR gate is activated during the data read step by the output of the exclusive OR controller.

4. A test pattern generator as defined in claim 3, wherein the second data generator provides the mask data to a write. enable/disable terminal of the memory device under test in the data write step.

5. A test pattern generator for generating test data, expected value data and mask data for testing a memory device, comprising:

an instruction memory for storing instructions and generating the instructions to perform a test process for a memory device under test;

a first data generator for generating test data and expected value data;

a second data generator for generating mask data for inhibiting the test data to be written in the memory device under test;

an exclusive OR (XOR) controller for generating a control signal based on the instructions from the instruction memory;

an AND gate for receiving an output signal of the XOR controller at one input terminal, and an inverse output signal of the second data generator at the other input terminal;

an exclusive OR (XOR) gate for performing an exclusive OR logic for the test data from the first data generator and an output signal of the AND gate; and a logic comparator for comparing an output signal of the memory under test with the expected value data from the first data generator when the memory under test has no write enable/disable function.

6. A test pattern generator as defined in claim 5, wherein an output signal of the exclusive OR gate is used as the expected value for comparing an output signal of the memory under test when the memory under test has a write enable/disable function.

7. A test pattern generator as defined in claim 5, wherein the test pattern generator provides the test data to the memory under test to write the test data therein in a data write step and provides the expected value data to the memory under test to read the stored data therefrom to compare the stored data with the expected valued data in a data read step, wherein the exclusive OR gate is activated during the data read step by the output of the exclusive OR controller.

8. A test pattern generator as defined in claim 5, wherein the second data generator provides the mask data to a write enable/disable terminal of the memory device under test in the data write step.

* * * * *